United States Patent [19]
Spikes, Jr. et al.

[11] Patent Number: 6,114,219
[45] Date of Patent: *Sep. 5, 2000

[54] METHOD OF MANUFACTURING AN ISOLATION REGION IN A SEMICONDUCTOR DEVICE USING A FLOWABLE OXIDE-GENERATING MATERIAL

[75] Inventors: Thomas E. Spikes, Jr., Round Rock; Sey-Ping Sun; Robert Dawson, both of Austin, all of Tex.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/929,865

[22] Filed: Sep. 15, 1997

[51] Int. Cl.⁷ .................................................. H01L 21/76
[52] U.S. Cl. ..................... 438/428; 438/436; 438/438; 438/692; 438/698
[58] Field of Search ................... 438/424–428, 438/434–440, 691–692, 760, 698

[56] References Cited

U.S. PATENT DOCUMENTS

| | | |
|---|---|---|
| 4,544,576 | 10/1985 | Chu et al. ................................. 427/82 |
| 5,145,723 | 9/1992 | Ballance et al. ...................... 427/397.7 |
| 5,244,827 | 9/1993 | Dixit et al. .................................. 438/424 |
| 5,435,888 | 7/1995 | Kalntsky et al. . |
| 5,506,177 | 4/1996 | Kishimoto et al. . |
| 5,518,950 | 5/1996 | Ibok et al. . |
| 5,530,293 | 6/1996 | Cohen et al. .............................. 257/752 |
| 5,629,242 | 5/1997 | Nagashima et al. ..................... 438/692 |
| 5,663,107 | 9/1997 | Peschke et al. .......................... 438/692 |
| 5,795,810 | 8/1998 | Houston .................................... 438/404 |

OTHER PUBLICATIONS

"Application Notes for Dow Corning® Flowable Oxide", Dow Corning Corporation, pp. 1–4 (1994).
"Product Information Dow Corning® Flowable Oxide", Dow Corning Corporation, pp. 1–4 (1994).
S. Wolf, "Isolation Technologies for Integrated Circuits", *Silicon Processing for the VLSI Era–Volume II*, pp. 12–66 (1990).

*Primary Examiner*—Jey Tsai

[57] ABSTRACT

A method for the manufacture of a semiconductor device with trench isolation regions includes forming at least one trench in a substrate to define one or more isolation regions. At least a portion of the trench is filled with a flowable oxide-generating material which is then formed into an oxide layer. An optional dielectric layer can be deposited over the oxide layer. A portion of the oxide layer and/or the optional dielectric layer is removed to generate a substantially planer surface.

20 Claims, 4 Drawing Sheets

METHOD OF MANUFACTURING AN ISOLATION REGION IN A SEMICONDUCTOR DEVICE USING A FLOWABLE OXIDE-GENERATING MATERIAL

FIELD OF THE INVENTION

The present invention is directed generally to a method of manufacturing a semiconductor device and, more particularly, to a method of forming an isolation region in a semiconductor device with a flowable oxide-generating material.

BACKGROUND OF THE INVENTION

Over the last few decades, the electronics industry has undergone a revolution through the use of semiconductor technology to fabricate small, highly integrated electronic devices. The most common semiconductor technology presently used is silicon-based. A large variety of semiconductor devices have been manufactured having various applications in numerous disciplines. Such silicon-based semiconductor devices often include metal-oxide-semiconductor (MOS) transistors, complimentary MOS (CMOS) transistors, bipolar transistors, bipolar CMOS (BiCMOS) transistors, etc.

Each of these semiconductor devices generally includes a semiconductor substrate on which a number of active devices are formed. The particular structure of a given active device can vary between device types. For example, in MOS transistors, an active device generally includes source and drain regions and a gate electrode which modulates current between the source and drain regions. In bipolar transistors, an active device generally includes a base, a collector, and an emitter.

Semiconductor devices, like the ones mentioned above, are used in large numbers to construct most modern electronic devices. As a larger number of such devices are integrated into a single silicon substrate, improved performance and capabilities of electronic devices can be achieved. In order to increase the number of semiconductor devices which may be formed on a given surface area of a substrate, the semiconductor devices must be scaled down (i.e., made smaller). This is accomplished by reducing the lateral and vertical dimensions of the device structure.

One important step in the formation of semiconductors is the process of electrically isolating adjacent active devices. One known technique for isolating active devices on a semiconductor substrate is LOCOS (LOCal Oxidation of Silicon) isolation. LOCOS isolation generally involves the formation of a recessed or semi-recessed oxide 20 in the nonactive (or field) areas 22 of a substrate 24 which separate the active devices 26, as illustrated in FIG. 1A.

In one particular LOCOS process, a thin silicon dioxide layer, often referred to as a pad oxide layer is grown on the surface of a semiconductor substrate. A relatively thick layer of silicon nitride is then deposited over the pad oxide layer. Using a mask and etch process, the pad oxide/nitride layers are then selectively removed to define active regions (generally those regions masked by the pad oxide/nitride layers) and field regions (generally those regions over which the pad oxide/nitride layers have been removed). The nitride layer acts as a mask during subsequent oxide growth. An oxide, typically referred to as a field oxide, is thermally grown in the field regions to a thickness ranging from 0.3 to 1.0 µm to electrically isolate the active regions. The pad oxide layer and nitride masking layer are then removed to expose the active regions of the substrate.

The structure resulting from LOCOS isolation techniques is typically associated with a number of limitations. One limitation in particular is the poor planarity of the resultant surface topography. This limits the maximum resolution of photolithography steps and serves to further impede scaling down of semiconductor devices. A second major limitation is the encroachment of the active area by the field oxide.

One alternative to LOCOS isolation is trench isolation. Trench isolation generally involves etching shallow trenches 28 in field regions 22 of the substrates 24 and refilling the trenches with a deposited silicon dioxide layer 30, which is etched back to yield a relatively planar surface, as depicted in FIG. 1B. Trench isolation generally improves the planarity of the surface topography of the device, as well as the junction edge capacitance. In general, trench isolation also provides better isolation and latch-up performance. However, current trench isolation techniques gives rise to other problems. For example, deleterious voids can form in the deposited silicon dioxide. These voids become more pronounced as the trenches become narrower.

Furthermore, achieving improved planarity using trench isolation is often difficult and costly. For example, the deposited silicon dioxide layer used to fill the trenches is typically conformally deposited using a technique such as chemical vapor deposition (CVD). This results in divots in the deposited silicon dioxide layer associated with the trenches. These divots make the planarization of the device surface difficult. The methods used to alleviate these divots generally involve further processing steps. Each of these steps adds to the overall cost and time to manufacture a semiconductor device. A more detailed discussion of the LOCOS and trench isolation techniques as well as the advantages and disadvantages resulting therefrom can be found in S. Wolf, *Silicon Processing For The VLSI Era*, Vol. 2: Processing Integration, Chap. 2, pp. 12–66, 1990.

SUMMARY OF THE INVENTION

Generally, the present invention relates to a method of manufacturing a semiconductor device with one or more trench isolation regions which are at least partially filled with a flowable oxide-generating material.

In one embodiment of the invention, at least one trench is formed in a substrate to define one or more isolation regions. At least a portion of the trench is filled with a flowable oxide-generating material which is used to form an oxide layer. A dielectric layer is formed over the oxide layer and a portion of the dielectric layer is removed to generate a substantially planer surface.

In another embodiment, an isolation trench is formed in a substrate of a semiconductor device. A thin thermal oxide layer is grown on a portion of the substrate which defines the trench and at least a portion of the trench is filled with a flowable oxide-generating material. An oxide layer is formed by heating the flowable oxide-generating material to convert the material into an oxide. A dielectric layer is deposited over the oxide layer and portions of the dielectric layer are removed to form a substantially planer surface.

A further embodiment includes forming at least one trench in a substrate to define one or more isolation regions. At least a portion of the trench is filled with a flowable oxide-generating material. An oxide layer is formed and a portion of the oxide layer is selectively removed to generate a substantially planer surface.

The above summary of the present invention is not intended to describe each embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
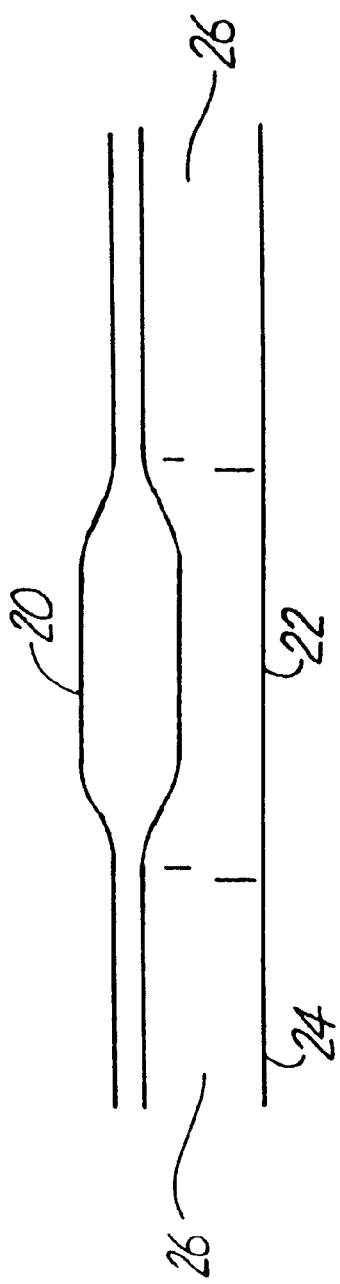
FIGS. 1A–1B illustrate two conventional isolation regions in a typical semiconductor device structure.
Figure 1B:
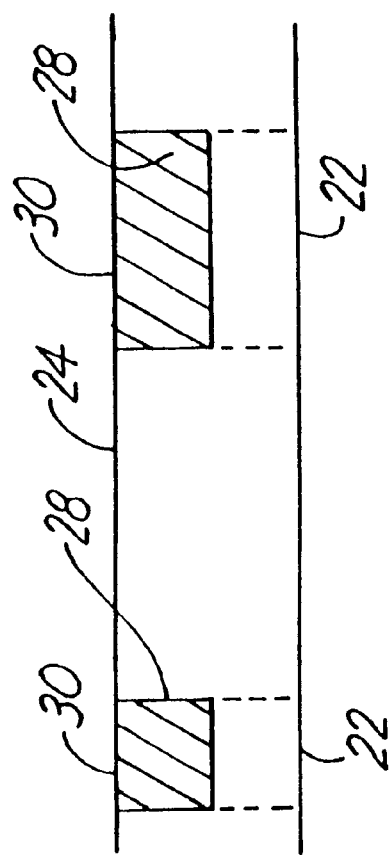

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices which employ trench isolation regions to separate active device regions. While the present invention is not so limited, an appreciation of various aspects of the invention will be gained through a discussion of the fabrication process in connection with the examples provided below.

Figure 2A:
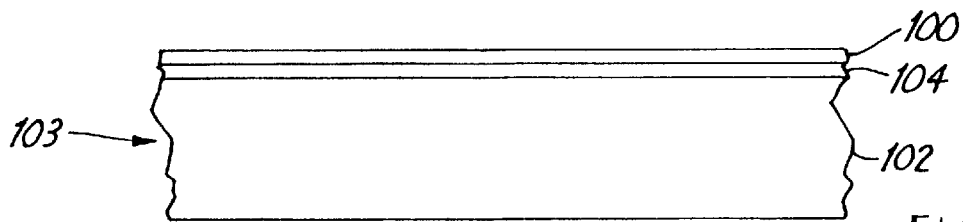
FIGS. 2A–2H illustrate a fabrication process in accordance with one embodiment of the invention.

FIGS. 2A–2H illustrate a process for fabricating a trench isolation region on a semiconductor substrate with the resultant substrate having a planar surface topography. Using known techniques, a masking layer 100 is formed on a substrate 102 of a wafer 103, as illustrated in FIG. 2A. An insulating layer 104 is typically formed between the masking layer 100 and the substrate 102. Together, the masking layer 100 and the insulating layer 104 form a mask which may be used to define the isolation regions of the substrate 102.

The substrate 102 is typically formed from silicon, however, other materials may be used. The insulating layer 104 is usually an oxide, such as silicon dioxide, and is often referred to as a pad oxide. The masking layer 100 is generally formed from a material selective to oxide such as a nitride, for example, silicon nitride.

It will be appreciated that a number of different known fabrication techniques can be used to form the mask. For example, a thin (50–600 angstrom) layer of silicon dioxide may be thermally grown on the substrate 102 to form the insulating layer 104. A thicker (500–2000 angstrom) layer of silicon nitride may then be deposited on the insulating layer 104 to create the masking layer 100. The silicon nitride can be deposited by a variety of techniques, including, for example, chemical vapor deposition (CVD) or physical vapor deposition.

Figure 2B:
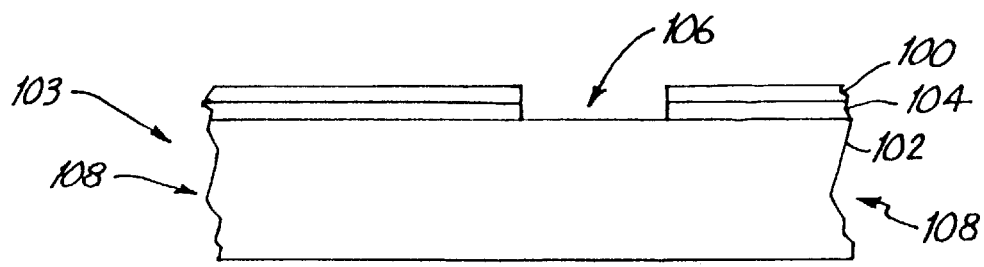

The masking layer 100 and the insulating layer 104 are selectively removed to expose the substrate and define the isolation regions 106 which typically separate the active regions 108 of the substrate. The resultant structure is illustrated in FIG. 2B. Selective removal of the masking layer 100 and the insulating layer 104 may be accomplished by, for example, standard photolithography and etching techniques.

Figure 2C:
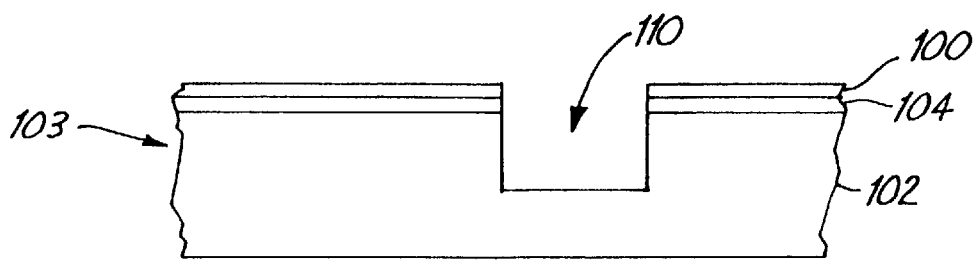

Following the removal of portions of the mask, one or more trenches 110 (only one of which is shown) are formed in the exposed regions of the substrate 102, as illustrated in FIG. 2C. The trench 110 may be formed using, for example, well-known etching methods and etchants. Ideally, the trench 110 has straight or slightly tapered sidewalls with rounded edges at the bottom. However, other trench configurations may be used. Typical trenches are between about 0.20 to 0.50 μm in depth, but trenches with other dimensions may be formed.

Figure 2D:
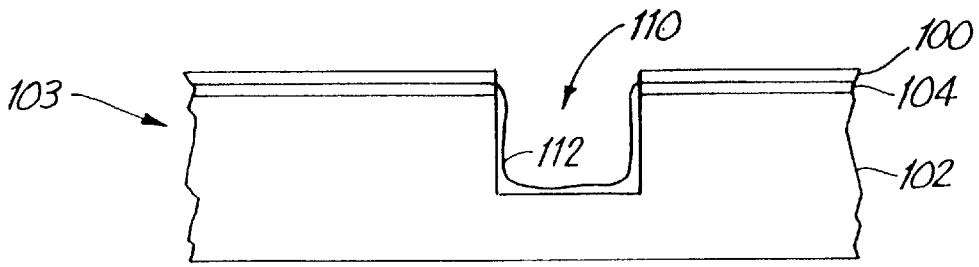

After the trench 110 is formed, a relatively thin (200–800 angstrom) oxide layer 112 may be formed within the trench 110, as shown in FIG. 2D. In one particular embodiment, the thin oxide layer 112 is a thermal oxide layer formed, for example, using standard thermal oxidation techniques, including, for example, the thermally controlled oxidation of silicon using gaseous $O_2$. The thin oxide layer 112 typically smoothes the edges and corners of the trench 110. In alternate embodiments, the thin oxide layer 112 may be omitted provided that sufficient filling of the trench 110 with a flowable oxide-generating material can be accomplished, as described below.

Figure 2E:
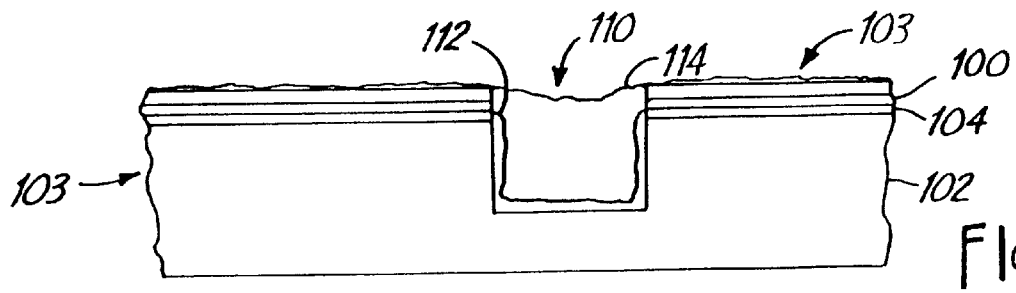

After the thin oxide layer 112 is formed, a flowable oxide-generating material 114 is deposited on the wafer 103 and allowed to flow into and at least partially fill the trench 110, as illustrated in FIG. 2E. One example of a suitable method for filling the trench 110 is to spin-on the flowable oxide-generating material 114. This method includes depositing the flowable oxide-generating material 114 on the wafer 103 and spinning the wafer 103 to spread the flowable oxide-generating material over the wafer, filling in depressions such as the trench 110. Generally, the flowable oxide-generating material flows either at room temperature or when heated.

In one embodiment, the flowable oxide-generating material 114 completely fills the trench 110. However, partial filling of the trench 110 by the material 114 may be desirable in some embodiments. In other embodiments, a portion of the flowable oxide-generating material 114 forms a film over all or a portion of the surface of the wafer 103 as shown in FIG. 2E.

Figure 2F:
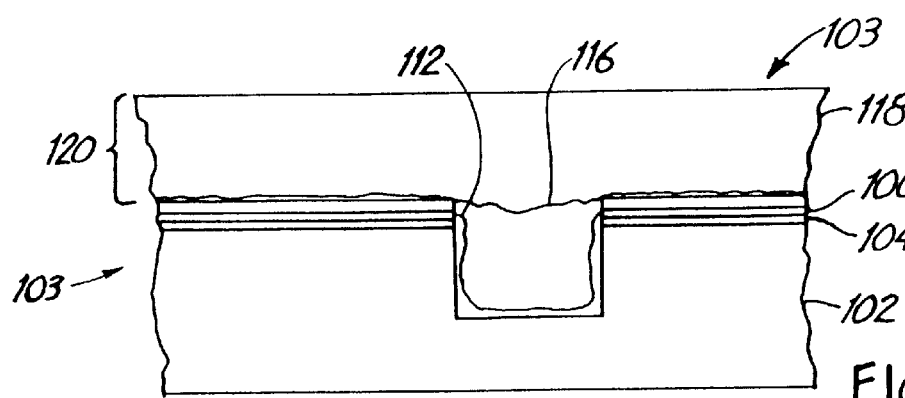

The flowable oxide-generating material is used to form an oxide layer 116 (see FIG. 2F). The oxide layer 116 is typically formed before the addition of other layers (e.g., the dielectric layer 118, described below) on the wafer 103, however, the invention is not so limited. The oxide layer 116 may be formed by a variety of processes. The particular formation process may depend on the flowable oxide-generating material that is used. Such processes include cooling the flowable oxide-generating material; reacting the material with a compound in the ambient atmosphere or other chemical reagent; removing a solvent by processes such as evaporation; causing a chemical reaction by heating the material beyond a threshold temperature; or a combination of these techniques.

One particularly suitable flowable oxide-generating material contains hydrogen silsesquioxane (HSQ). One commercially available form of a flowable oxide-generating material is Dow Corning® Flowable Oxide (Dow Corning, Midland, Mich.). This product flows when heated above about 200° C. Upon heating to higher temperatures (about 400–800° C.), the Dow Corning Flowable® Oxide converts to an oxide glass, thereby generating the oxide layer 116.

After the trench 110 is filled with the flowable oxide-generating material 114, a dielectric layer 118 is formed on the wafer 103, over the trench 110 and the masking layer 100, as illustrated in FIG. 2F. The dielectric layer 118 is typically formed after the flowable oxide-generating material 114 has been converted into an oxide layer 116. The dielectric layer 118 may, for example, be between about 2000 and about 8000 angstroms thick.

The formation of the dielectric layer 118 can be accomplished using, for example, well-known techniques such as chemical vapor deposition (CVD) or physical vapor deposition. One example of a suitable material for the creation of the dielectric layer 118 is tetraethoxy silane (TEOS) which is converted to silicon dioxide during the CVD process.

In some embodiments, the dielectric layer 118 is a stack of layers (not shown) formed over the oxide layer 116. Suitable materials for each layer in the stack of layers include, for example, silicon dioxide, and stoichiometric or nonstoichiometric silicon nitride or silicon oxynitride materials. Typically, the top layer of the stack of layers is a silicon dioxide layer made, for example, using TEOS.

Chemical vapor deposition (CVD) or plasma enhanced chemical vapor deposition (PECVD) of materials such as silicon dioxide, silicon nitride, or silicon oxynitride typically forms a dielectric layer, the upper surface of which is a generally conformal map of the surface upon which the material is deposited. Using the flowable oxide-generating material 114 to fill the trench 110 often eliminates or substantially reduces the size of divots in the dielectric layer 118, resulting from the uneven surface of the substrate. This may reduce the number of steps, and the amount of material and time needed to polish and planerize the surface.

Figure 2G:
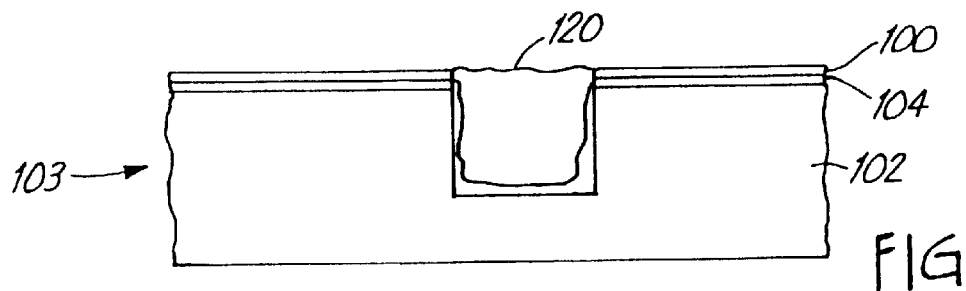

Even though the layers 116, 118 are often made of different materials, these layers 116, 118 can be considered a single combined dielectric layer 120. A portion of this combined dielectric layer 120 is removed to form a relatively planer surface, as illustrated in FIG. 2G. This may be accomplished, for example, using known polishing techniques, such as chemical/mechanical polishing (CMP). Such methods may include chemical etching, physical abrasion, or a combination thereof. Typically, the combined dielectric layer 120 is polished so that it is substantially level with the masking layer 100. A portion of the masking layer 100 may be removed during polishing. In alternate embodiments, the combined dielectric layer 120 is overpolished to provide a relatively planer oxide layer which is recessed with respect to the upper surface of the masking layer 100.

Figure 2H:
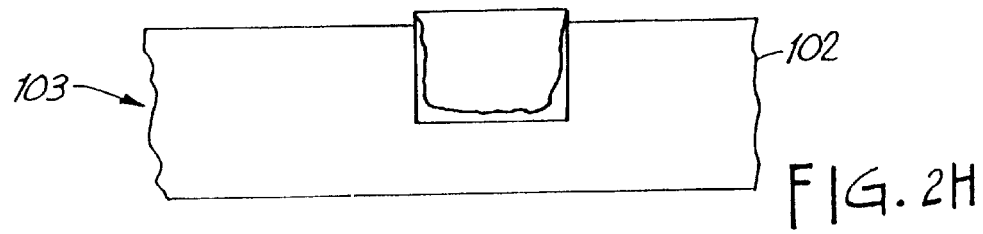

The insulating layer 104 and/or masking layer 100 may be removed, as shown in FIG. 2H, to expose the active regions of the wafer 103. The insulating layer 104 and the masking layer 100 may be removed using, for example, well-known techniques, such as wet-etching. The resulting structure has a relatively planer surface, although the planer surface of the combined dielectric layer 120 may extend slightly above the surface of the substrate 102. Typically, the step height between the surfaces of the substrate 102 and the oxide layer 120 is minimal. This step height may be reduced by overetching the oxide layer 120 prior to removal of the masking layer 100 and the insulating layer 104.

Figure 3A:
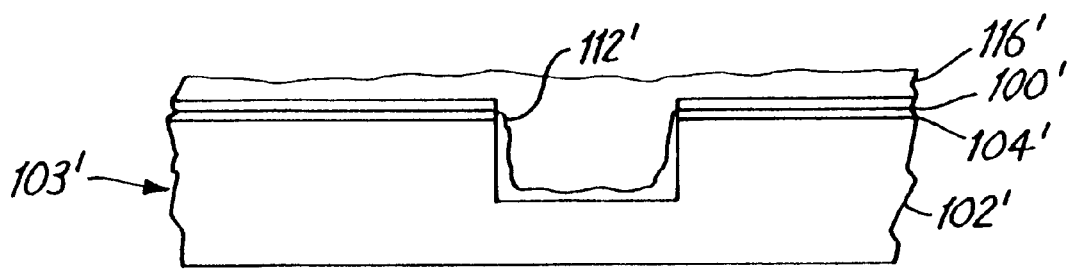
FIGS. 3A–3B illustrate a fabrication process in accordance with another embodiment of the invention.
Figure 3B:
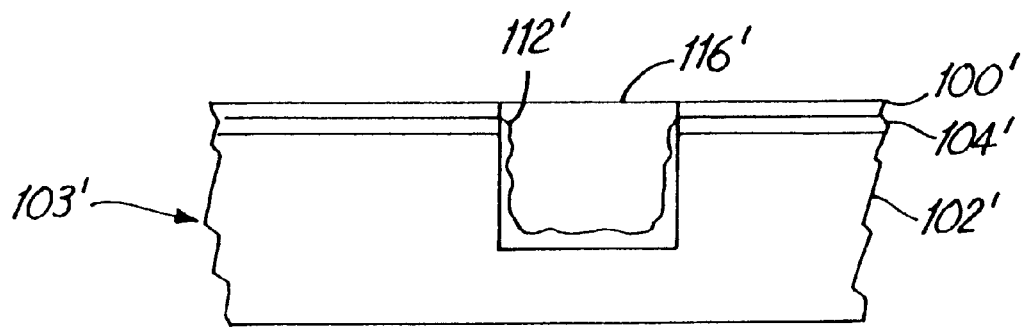

In alternate embodiments, the flowable oxide-generating material 114' substantially coats the substrate 102', as illustrated in FIG. 3A, and a dielectric layer is not needed. In these embodiments, the flowable oxide-generating material forms an oxide layer 116', a portion of which is removed to form a relatively planer surface, as illustrated in FIG. 3B. Removal of the oxide layer 116' can be accomplished by well-known techniques, such as polishing. The masking layer 100' and insulating layer 104' may be removed, as described above, to leave a relatively planar surface.

Using the above processes, relatively planer trench isolation regions can be formed in a semiconductor substrate. Moreover, using a flowable oxide-generating material to partially or completely fill the trenches in the field areas of the semiconductor substrate may decrease the number of steps and the amount of time and material required to obtain the planer surface. In particular, the use of a flowable oxide-generating material substantially reduces the depth of divots formed using conventional processes, which then require additional processing steps to planarize the surface.

As noted above, the present invention is applicable to the fabrication of a number of different devices where an isolation region is formed in a substrate. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A method of making a semiconductor device, comprising:
   forming, on a substrate, a patterned masking layer exposing at least one isolation region;
   forming a trench in one or more of the isolation regions for separating adjacent active devices;
   completely filling the trench with a flowable oxide-generating material containing a solvent;
   heating the flowable-oxide generating material to remove the solvent and further heating the flowable oxide generating material to convert the flowable oxide-generating material into an oxide layer, wherein the flowable oxide-generating material flows subsequent to removing the solvent and prior to converting into the oxide layer;
   forming a dielectric layer over the oxide layer by chemical vapor deposition; and
   selectively removing a portion of the dielectric layer, prior to depositing any other layer on the dielectric layer, to generate a substantially planer surface with the masking layer.

2. The method of claim 1, wherein forming the patterned masking layer comprises:
   forming an insulating layer on the surface of the substrate;
   forming a masking layer on the insulating layer; and
   selectively removing portions of the masking layer and the insulating layer to define the exposed region.

3. The method of claim 1, wherein the method further comprises removing a portion of the oxide layer to generate the substantially planer surface with the masking layer.

4. The method of claim 1, wherein the dielectric layer comprises silicon dioxide.

5. The method of claim 1, wherein the dielectric layer has a thickness between about 2000 to about 8000 angstroms.

6. The method of claim 1, wherein the method further comprises growing a thermal oxide layer on portions of the substrate defining the trench prior to completely filling the trench with a flowable oxide-generating material.

7. The method of claim 6, wherein the thermal oxide layer is grown to a thickness between about 200 to about 800 angstroms.

8. The method of claim 1, wherein the flowable oxide-generating material comprises a silicon compound.

9. The method of claim 1, wherein the flowable oxide-generating material comprises hydrogen silsesquioxane.

10. The method of claim 1, wherein completely filling the trench comprises:

depositing the flowable oxide-generating material on the substrate; and spinning the substrate to cause the flowable oxide-generating material to flow into and completely fill the trench.

11. The method of claim 10, wherein completely filling the trench further comprises heating the flowable oxide-generating material to cause the material to flow into and completely fill the trench.

12. The method of claim 1, wherein the flowable oxide-generating material covers at least a portion of the masking layer.

13. The method of claim 1, wherein the flowable oxide-generating material is converted into an oxide layer prior to forming the dielectric layer.

14. The method of claim 1, wherein the method further comprises selectively removing the masking layer while leaving the oxide layer completely filling the trench.

15. A method of forming a semiconductor device, comprising:

forming, on a substrate, a patterned masking layer exposing an isolation region forming a trench in the isolation region for separating adjacent active devices;

growing a thin thermal oxide layer on sidewalls of the trench to leave a remaining portion of the trench;

completely filling the remaining portion of the trench with a flowable oxide-generating material containing a solvent;

heating the flowable-oxide generating material to remove the solvent and further heating the flowable oxide generating material to convert the flowable oxide-generating material into an oxide layer, wherein the flowable oxide-generating material flows subsequent to removing the solvent and prior to converting into the oxide layer;

depositing, by chemical vapor deposition, a dielectric layer over the oxide layer; and selectively removing portions of the dielectric layer, prior to depositing any other layer on the dielectric layer, to form a substantially planar surface with the masking layer.

16. A method of forming a semiconductor device, comprising:

forming, on a substrate, a patterned masking layer exposing at least one isolation region;

forming a trench in one or more of the isolation regions for separating adjacent active devices;

flowing hydrogen silsesquioxane to completely fill the trench;

forming an oxide layer with the hydrogen silsesquioxane;

depositing a dielectric layer over the oxide layer by chemical vapor deposition; and selectively removing a portion of the dielectric layer to generate a substantially planer surface with the masking layer.

17. The method of claim 1, wherein forming a trench comprises forming a trench having a depth of 0.20 to 0.50 $\mu$m.

18. The method of claim 1, wherein heating the flowable-oxide generating material comprises heating the flowable oxide-generating material to a temperature in range of 400 to 800° C. to convert the flowable oxide-generating material into an oxide layer after the flowable oxide-generating material flows.

19. The method of claim 1, wherein forming a dielectric layer comprises forming, by chemical vapor deposition, a dielectric layer over the oxide layer, the dielectric layer having a thickness in a range of 2000 to 8000 Angstroms.

20. The method of claim 16, further comprising forming a thermal oxide layer on sidewalls of the trench prior to flowing hydrogen silsesquioxane to completely fill the trench.

* * * * *